United States Patent
Yamagata

(10) Patent No.: US 6,844,754 B2
(45) Date of Patent: Jan. 18, 2005

(54) DATA BUS

(75) Inventor: Tadato Yamagata, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 113 days.

(21) Appl. No.: 10/299,712

(22) Filed: Nov. 20, 2002

(65) Prior Publication Data
US 2003/0234664 A1 Dec. 25, 2003

(30) Foreign Application Priority Data
Jun. 20, 2002 (JP) ...................... 2002-179969

(51) Int. Cl.$^7$ .......................................... H03K 19/003
(52) U.S. Cl. .......................................... 326/30; 326/21
(58) Field of Search ..................... 326/30, 21; 333/32, 333/24

(56) References Cited

U.S. PATENT DOCUMENTS

| | | | | |
|---|---|---|---|---|
| 5,467,455 A | * | 11/1995 | Gay et al. ................... | 710/100 |
| 6,356,106 B1 | * | 3/2002 | Greeff et al. ................. | 326/30 |
| 6,690,191 B2 | * | 2/2004 | Wu et al. ..................... | 326/30 |
| 2003/0197528 A1 | * | 10/2003 | Shibata et al. ................ | 326/86 |

FOREIGN PATENT DOCUMENTS

| JP | 8-194034 | 7/1996 |
|---|---|---|
| JP | 2001-177580 | 6/2001 |

OTHER PUBLICATIONS

Standard of Electronic Industries Association of Japan, "Stub Series Terminated Logic for 2.5 Volts (SSTL_2) (A 2.5 V Supply Voltage Based Interface Standard for Digital ICS)," EIAJ ED–5513, Aug. 1998, p. 11.

Intel "PC SDRAM Registered Dimm Design Support Document (Intel)," Revision 1.1, Oct. 1998, p. 31.

* cited by examiner

Primary Examiner—James H. Cho
(74) Attorney, Agent, or Firm—Oblon, Spivak, McClelland, Maier & Neustadt, P.C.

(57) ABSTRACT

In a memory system having a data bus transferring data in either direction, highly reliable data transfer is provided regardless of the direction in which data is transferred. The signal lines of a data bus (12) bidirectionally transfer data. That is to say, during data write operations to a DIMM, the signal lines transfer data from a memory controller (10) to the DIMM, and during data read operations, they transfer data from the DIMM to the memory controller (10). The signal lines have, as terminating resistors, terminating variable resistors (VRt) whose impedance is controlled by the memory controller (10). During data write operations to the DIMM, the memory controller (10) sets the impedance of each terminating variable resistor (VRt) at a value suitable for writing, and during data read operations, it sets the impedance of each terminating variable resistor (VRt) at a value suitable for reading.

7 Claims, 10 Drawing Sheets

F I G. 4
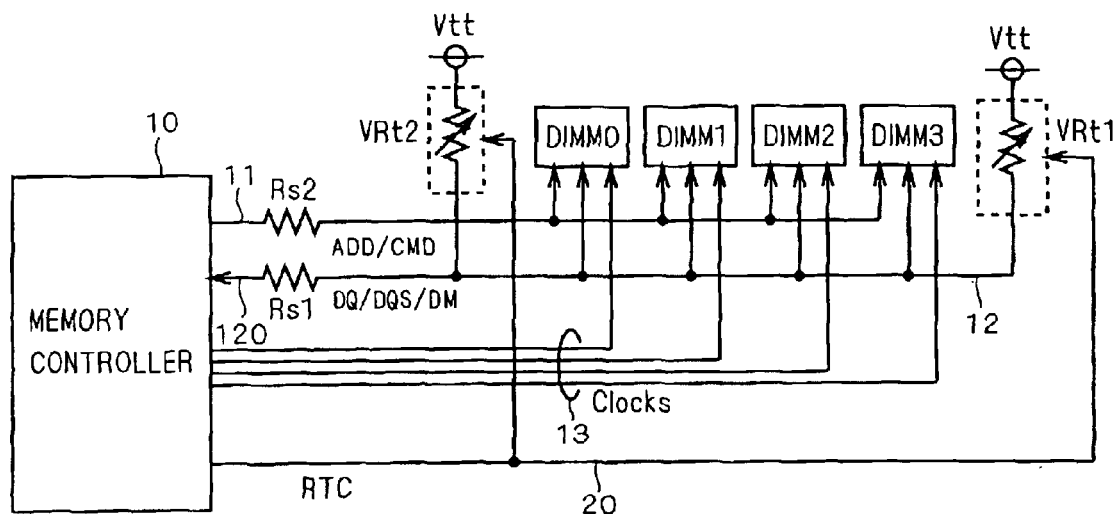
F I G. 5
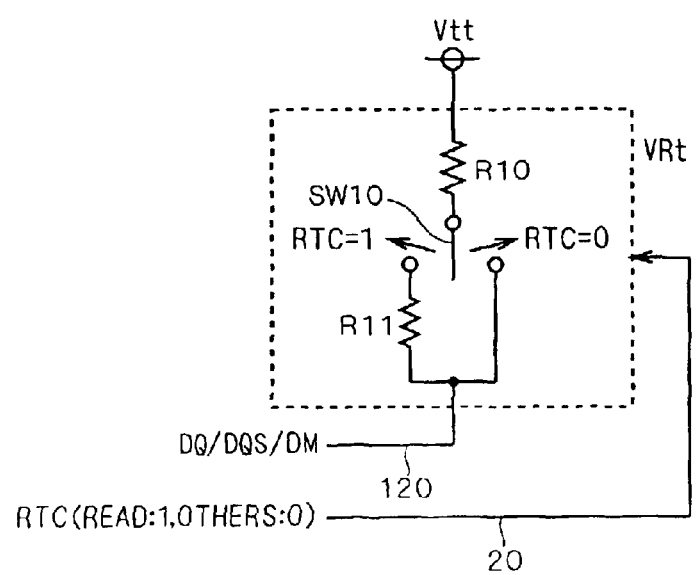

F I G . 1 6  PRIOR ART
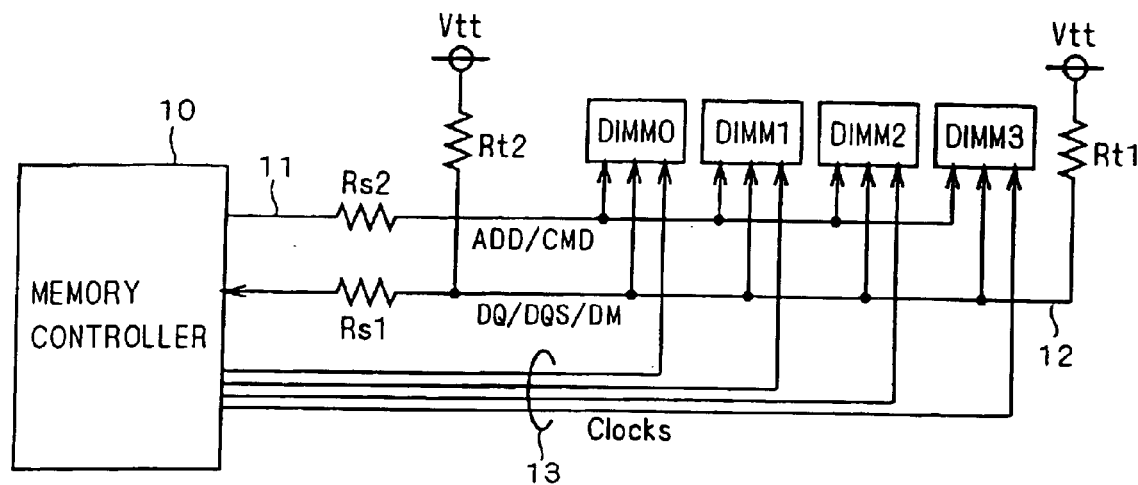

DATA BUS

BACKGROUND OF THE INVENTION

1. Field of the Invention

The present invention relates to a technique for transmitting/receiving data using a data bus.

2. Description of the Background Art

FIGS. 15 and 16 are diagrams each showing the structure of a conventional memory system constructed on a motherboard of a computer system. The diagrams show examples of a memory system that includes four DIMMs (Dual Inline Memory Modules) having DRAMs (Dynamic Random Access Memories). As shown in the diagrams, the four DIMMs (DIMM 0 to DIMM 3) and a memory controller 10 are connected through an address/command bus 11, a data bus 12, and clock lines 13.

Through the address/command bus 11 and the data bus 12, the memory controller 10 controls operations of the four DIMMs and also reads/writes data from/to the DIMMs. The address/command bus 11 transfers command signals (CMD) and address signals (ADD) from the memory controller 10 to the individual DIMMs. The command signals (CMD) are signals with which the memory controller 10 instructs the individual DIMMs to perform data writing or reading. The address signals (ADD) are signals for specifying addresses of the DRAMs to be read or written.

The data bus 12, which transfers data between the memory controller 10 and the individual DIMMs, is capable of transferring data in either direction between the memory controller 10 and the DIMMs. That is to way, when the memory controller 10 writes data into the DIMMs, the data bus 12 transfers data output (write data) from the memory controller 10 to the DIMMs; when the memory controller 10 reads data from the DIMMs, it transfers data output (read data) from the DIMMs to the memory controller 10.

Signals transferred through the data bus 12 between the memory controller 10 and the DIMMs include the data signal (DQ) to be written and read, data strobe signals (DQS) used when the memory controller 10 or the DRAMs in the DIMMs capture data, signals for masking data (DM), etc. Though not shown for the sake of simplicity, memory bus like the address/command bus 11 and the data bus 12 is each composed of a set of signal lines. For example, the data bus 12 carrying DQ/DQS/DM is generally composed of about 108 signal lines.

The memory controller 10 also sends a reference clock signal to the DIMMs through the clock lines 13: the reference clock signal has a reference frequency as an operating timing reference of the memory system.

The operation of the conventional memory system shown in FIG. 15 is now described briefly. For example, when writing data into a DIMM, the memory controller 10 first outputs a command signal (CMD) to the DIMM through the address/command bus 11 to indicate data writing and also outputs an address signal (ADD) to specify the write address. Then the memory controller 10 transfers the write data to the DIMM through the data bus 12 and the data is written in the specified address.

On the other hand, when reading data from the DIMM, the memory controller 10 first outputs a command signal (CMD) to the DIMM through the address/command bus 11 to indicate data reading and also outputs an address signal (ADD) to specify the read address. Then the data stored in the specified address in the DIMM is read out. The data (read data) is transferred through the data bus 12 to the memory controller 10 and read in by the memory controller 10.

When reflections occur during the transfer of a data signal on a memory bus like the address/command bus 11 or data bus 12, it causes signal distortion. Therefore, in order to suppress reflections, it is important to achieve impedance matching on the signal lines of the memory bus. Accordingly, each signal line of memory bus is generally terminated with a given terminating resistor.

For example, in FIG. 15, the data bus 12 is provided with series resistors Rs1 series-connected to the signal lines and terminating resistors Rt. The address/command bus 11 is provided with series resistors Rs2 series-connected to the signal lines. The terminating resistors Rt are connected to a given voltage Vtt which is usually set at a voltage about half the power-supply voltage. Though the individual signal lines forming the memory bus are not shown in the drawings, the signal lines of the memory bus have their respective series and terminating resistor.

In general, the signal distortion at the end receiving the transferred signal can be more effectively suppressed as the terminating resistor is placed closer to the receiving end. Since the data bus 12 transfers signals in both directions as mentioned earlier, terminating resistors may be connected as shown in FIG. 16 to the signal lines of the data bus 12, considering data transfer during data read from the DIMMs. That is to say, at a first end of the data bus 12 to which the memory controller 10 is connected, terminating resistors Rt2 may also be connected to the signal lines in a position closer to the memory controller 10 than the DIMMs (i.e between the memory controller 10 and the DIMMs). Then, during read operations from the DIMMs, distortions of signals received at the memory controller 10 can be suppressed more effectively than in the example of FIG. 15.

Recently, in order to increase the operating speed and to reduce the power consumption of memory systems, there is a tendency to set lower the amplitude of signals sent between the memory controller 10 and the DIMMs. This reduces the margin of signal amplitude, which increases the importance of suppressing the signal distortion. Therefore, in order to suppress signal distortion caused by reflections, it is becoming more important to achieve impedance matching by connecting series resistors and terminating resistors to the memory bus signal lines.

When signal lines bidirectionally transfer data, as the data bus 12 shown in the example above, and especially when the transferred signals have higher frequencies, it is difficult to well balance impedance matching during signal transfer in one direction and impedance matching during transfer in the other direction. That is to say, the signal distortion suppressing effect produced by the terminating resistors Rt1 and Rt2 and the series resistors Rs1 of the data bus 12 may differ in degree depending on the direction of data transfer. In this case, the series and terminating resistors provide unequal effects in suppressing the signal distortion during data write to the DIMMs (during data transfer from the memory controller 10 to the DIMMs) and during data read from the DIMMs (during data transfer from the DIMMs to the memory controller 10).

For example, when the impedance of each terminating resistor is set to effectively suppress signal distortion during data write to the DIMMs, then impedance mismatch occurs during read and distortion is caused in the waveform of the read data signal. This makes it necessary to allow some margin for the amplitude of signals transferred on the data bus 12, which hinders achievement of higher operating speed and reduced power consumption of the memory system.

SUMMARY OF THE INVENTION

In a data bus bidirectionally transferring data, an object of the present invention is to provide a data bus capable of highly reliably transferring data regardless of the direction of data transfer.

According to a first aspect of the invention, a data bus includes a signal line capable of bidirectionally transferring data and at least one terminating element for terminating the signal line. The at least one terminating element has impedance that can be varied in accordance with the direction in which the data is transferred.

The impedance of the terminating element can be set at different values in accordance with the direction of data transfer so that data can be properly transferred in either direction.

According to a second aspect of the invention, a data bus includes a signal line capable of bidirectionally transferring data and a variable impedance element connected in series to the signal line. The variable impedance element has impedance that can be varied in accordance with the direction in which the data is transferred.

The impedance of the variable impedance element can be set at different values in accordance with the direction of data transfer so that data can be properly transferred in either direction.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a diagram showing a modification of the memory system of the first preferred embodiment;

FIG. 5 is a diagram showing an example of the structure of the terminating variable resistors in a memory system according to a second preferred embodiment;

FIGS. 15 and 16 are diagrams each showing the structure of a conventional memory system.

DESCRIPTION OF THE PREFERRED EMBODIMENTS

<First Preferred Embodiment>

Figure 1:
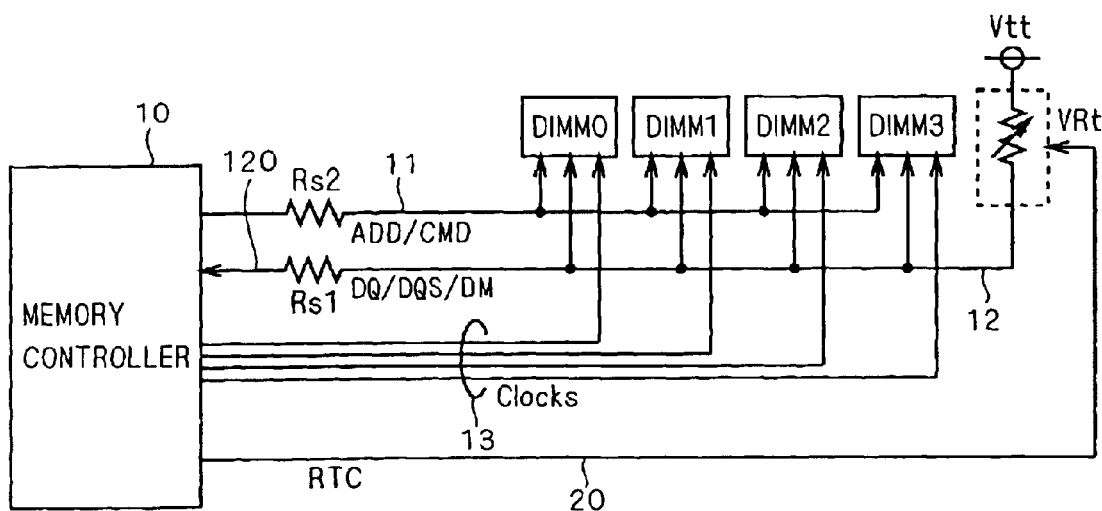
FIGS. 1 and 2 are diagrams showing the structure of a memory system according to a first preferred embodiment.
Figure 15:
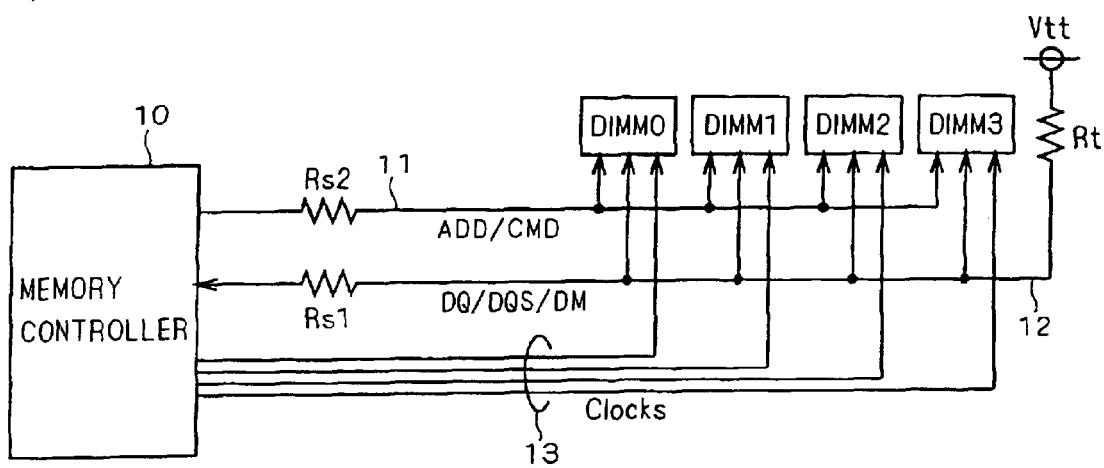

FIG. 1 is a diagram showing the structure of a memory system to which a data bus of a first preferred embodiment of the invention can be applied. In this diagram, the same components as those shown in FIG. 15 are denoted by the same reference characters and are not described in detail here again. In this preferred embodiment, as shown in FIG. 1, the data bus 12 includes signal lines 120, variable resistors VRt (hereinafter referred to as "terminating variable resistors") as terminating elements for terminating the signal lines 120, and series resistors Rs1. The signal lines 120 each have a first end which is connected via the series resistor Rs1 to the memory controller 10 for sending write data to the DIMMs and receiving read data from the DIMMs, and a second end which is connected to the terminating variable resistor VRt. At least one third end branches off between the first and second ends, to which the DIMMs are connected.

The impedance (resistance value) of the terminating variable resistors VRt can be controlled with an externally applied control signal (hereinafter referred to as an "RTC signal"). For example, the memory controller 10 may output the RTC signal, while controlling data write and read operations to and from the DIMMs. When the memory controller 10 thus has a function as an impedance controlling portion for controlling the impedance of the terminating variable resistors VRt, in other words, when the impedance controlling portion is contained in the memory controller 10, the memory system can be made smaller in size. The RTC signal is given to the terminating variable resistors VRt through an RTC line 20 for transferring the RTC signal.

Figure 2:
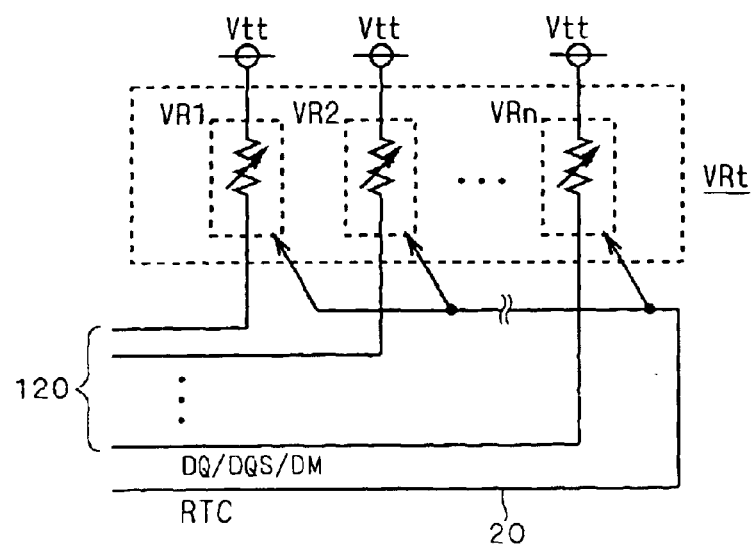

As mentioned earlier, the data bus 12 is usually composed of a plurality of signal lines (e.g. about 108 signal lines), where each signal line must be provided with a terminating resistor. Thus, in reality, as shown in FIG. 2, terminating variable resistors VR1 to VRn (n is 108, for example) are respectively connected to the signal lines of the data bus 12, though not shown in FIG. 1 for the sake of simplicity.

While each signal line of the data bus 12 has a terminating resistor also in the preferred embodiments described hereinafter, the drawings shown hereinafter depict, for the sake of simplicity, a plurality of terminating resistors as one terminating resistor as in FIG. 1.

As mentioned earlier, when the signal lines of the data bus 12 bidirectionally transfer signals, and especially when the transferred signals have higher frequencies, it is difficult to well balance impedance matching during data write to the DIMMs (a write mode: data is transferred from the memory controller 10 to the DIMMs) and during data read from the DIMMs (a read mode: data is transferred from the DIMMs to the memory controller 10). Accordingly, in the memory system of this preferred embodiment, the memory controller 10 appropriately sets the impedance of the terminating variable resistors VRt in accordance with the operation mode, i.e., depending on the direction in which data is transferred.

That is to say, in the write mode, the memory controller 10 sets the impedance of the terminating variable resistors VRt at an impedance appropriate for the write mode (hereinafter referred to as "write impedance"), and in the read mode, it sets an impedance appropriate for the read mode (hereinafter referred to as "read impedance"). This enables highly reliable data transfer through the data bus 12 whichever the operation mode is.

Figure 3:
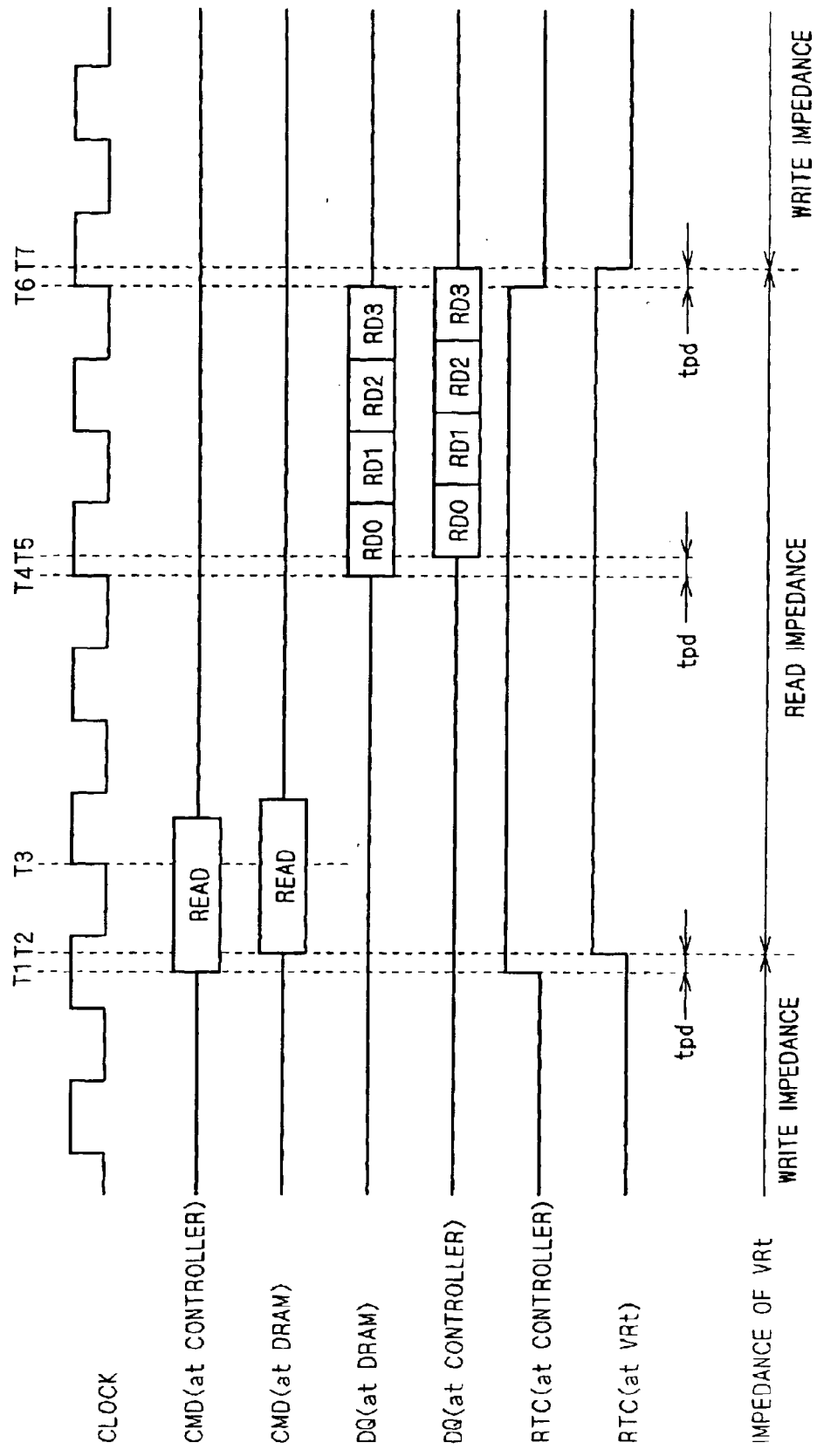
FIG. 3 is a timing chart showing operation of the memory system of the first preferred embodiment.

FIG. 3 is a timing chart showing the operation of the memory system of this preferred embodiment. The operation of the memory system of this preferred embodiment is now described referring to FIG. 3. For the sake of simplicity of description, it is assumed that the address/command bus 11, the data bus 12 and the RTC line 20 all have an equal propagation delay of "tpd." It is also assumed that, at first, in an initial state, the output of the RTC signal (RTC) from the memory controller 10 is set at "0" and the impedance of the terminating variable resistors VRt is set at the write impedance.

Then, suppose that the memory system enters the read mode where the memory controller 10 reads data from a DIMM. In this case, at time T1, the memory controller 10 outputs through the address/command bus 11 to the DRAM in the DIMM a command signal (CMD) "Read" indicative of reading, and also outputs an address signal (not shown) for specifying the address to be read. At the same time, the memory controller 10 also sets the RTC signal (RTC) at level "1" and outputs the RTC signal to the terminating variable resistors VRt through the RTC line 20.

The command signal "Read" outputted from the memory controller 10 at time T1 arrives at the DRAM at time T2, i.e. after the propagation delay tpd. The RTC signal "1" arrives at the terminating variable resistors VRt at the same time T2. Receiving the RTC signal "1," each terminating variable resistor VRt varies its impedance to the read impedance.

Then, the command signal "Read" arriving at the DRAM from the memory controller 10 is recognized by the DRAM at time T3 at which the reference clock signal rises right after time T2. Then, at given time T4 (in the example of FIG. 3, two clocks after the time T3 at which the command signal "Read" was recognized), the DRAM that recognized the command signal "Read" outputs onto the data bus 12 the data stored at the address specified by the address signal. In the example of FIG. 3, 4-bit data RD0–RD3 is sequentially outputted from the DRAM.

The series of data RD0–RD3 outputted from the DRAM starts arriving at the memory controller 10 at time T5 after the propagation delay tpd, and is sequentially read in by the memory controller 10 in timing synchronization with the reference clock (the timing of DQS signal). In this process, the memory controller 10 keeps the RTC signal at "1" till time T6 at which the last data RD3 is read in by the memory controller 10, and then sets it back to "0." Then the RTC signal "0" arrives at the terminating variable resistors VRt at time T7 after the propagation delay tpd. Each terminating variable resistor VRt, receiving the RTC signal "0." varies its impedance to the write impedance.

As can be seen from FIG. 3, the terminating variable resistors VRt provide the read impedance between time T2 and time T7. That is to say, the impedance of the terminating variable resistors VRt is kept at the read impedance during the period in which the DIMM is read.

Though not shown, during periods other than the read mode (during the write mode, standby state, etc.), the memory controller 10 keeps the RTC signal at "0" to cause the terminating variable resistors VRt to keep the write impedance. Therefore, when the memory system enters the write mode and the memory controller 10 writes data to DIMM, the impedance of the terminating variable resistors VRt is the write impedance.

As shown above, according to the data bus of this preferred embodiment, the impedance of the terminating variable resistors VRt equals the read impedance during the read mode and equals the write impedance during other operations. That is, the terminating variable resistors VRt exhibit the read impedance during the read mode and the write impedance during the write mode. Thus, whether the operation mode is the read mode or the write mode, i.e. whichever direction data is transferred, the data bus 12 can provide highly reliable data transfer.

For example, the impedance values of the terminating variable resistors VRt for the individual operation modes, i.e. the read and write modes, may be set to values obtained by analysis through experiments or computer simulations, or to values obtained on the basis of given standards. The values may be determined in different manners depending on the objects of provision of the terminating resistors in the individual operation modes.

For example, when the object in both read and write modes is to suppress signal distortion caused by reflections, the values of the read impedance and write impedance of the terminating variable resistors VRt can be determined so that impedance matching can be achieved in both operation modes.

On the other hand, when the main object in the read mode is to enlarge the signal waveform amplitude to ensure a larger operation margin and the main object in the write mode is to suppress the signal distortion due to reflections, then the value of the write impedance of the terminating variable resistors VRt can be set so that impedance matching can be achieved, and the value of the read impedance can be set at a value relatively larger than the write impedance.

The application of the invention is not limited to memory systems constructed as shown in FIG. 1; it is clear that the invention can be widely applied to any data transfer system having a data bus with signal lines that bidirectionally transfer data.

FIG. 4 is a diagram showing a modification of the memory system of the first preferred embodiment. At the first end of each signal line 120 of the data bus 12, a terminating variable resistor VRt2 for terminating the signal line 120 is further provided along with the series resistor Rs1. In other words, the terminating elements include the terminating variable resistors VRt1 connected at the second end of the signal lines 120 and the terminating variable resistors VRt2 connected at the first end of the signal lines 120. The impedances of the terminating variable resistors VRt1 and VRt2 are both controlled by the RTC signal. In other respects this memory system has the same structure as the memory system shown in FIG. 1.

As mentioned earlier, the signal distortion at the signal receiving end of the signal line can be more effectively suppressed as the terminating resistor is placed closer to the receiving end. Therefore this modification can still more effectively suppress the signal distortion in the read mode than the memory system shown in FIG. 1.

<Second Preferred Embodiment>

This preferred embodiment shows a more specific example of the structure of the terminating variable resistor VRt shown in the first preferred embodiment. The general structure and operation of the memory system of this preferred embodiment are the same as those shown in FIGS. 1 to 3 in the first preferred embodiment, so that they are not described again here.

Now, as in the example above, it is assumed that the main object in the read mode is to enlarge the signal waveform amplitude to ensure a larger operation margin and the main object in the write mode is to suppress signal distortion due to reflections. In this case, the value of the write impedance of each terminating variable resistor VRt may be set at a value that can achieve impedance matching during write operations and the value of the read impedance may be set at a value larger than the write impedance. In this case, each terminating variable resistor VRt may be constructed as shown in FIG. 5, for example.

In FIG. 5, a resistor R10 has a write impedance (here, a resistance value that can achieve impedance matching during write operations) and a resistor R11 has a given impedance (resistance value), and a relay SW10 is switched by the RTC signal sent from the memory controller 10. As shown in FIG. 5, when the RTC signal is "1" (i.e. in read operation), the relay SW10 connects the resistor R10 to the resistor R11, and when the RTC signal is "0" (i.e. in operations other than read operation), it connects the resistor R10 directly to the signal line 120 of the data bus 12.

When the terminating variable resistor VRt is constructed as shown in FIG. 5, its impedance during write operations exhibits a value that achieves impedance matching, and during read operations, it exhibits a value larger than the write impedance. This certainly and easily provides a sufficient operation margin in the read mode and suppresses signal distortion in the write mode.

In the memory system of the present invention, as is clear from this example, the terminating resistors can provide different effects in the read and write modes.

<Third Preferred Embodiment>

This preferred embodiment shows another example of operation for controlling the terminating variable resistors VRt in the memory system. The structure of the memory system of this preferred embodiment is the same as that shown in FIGS. 1 and 2 and therefore not described in detail again here.

Figure 6:
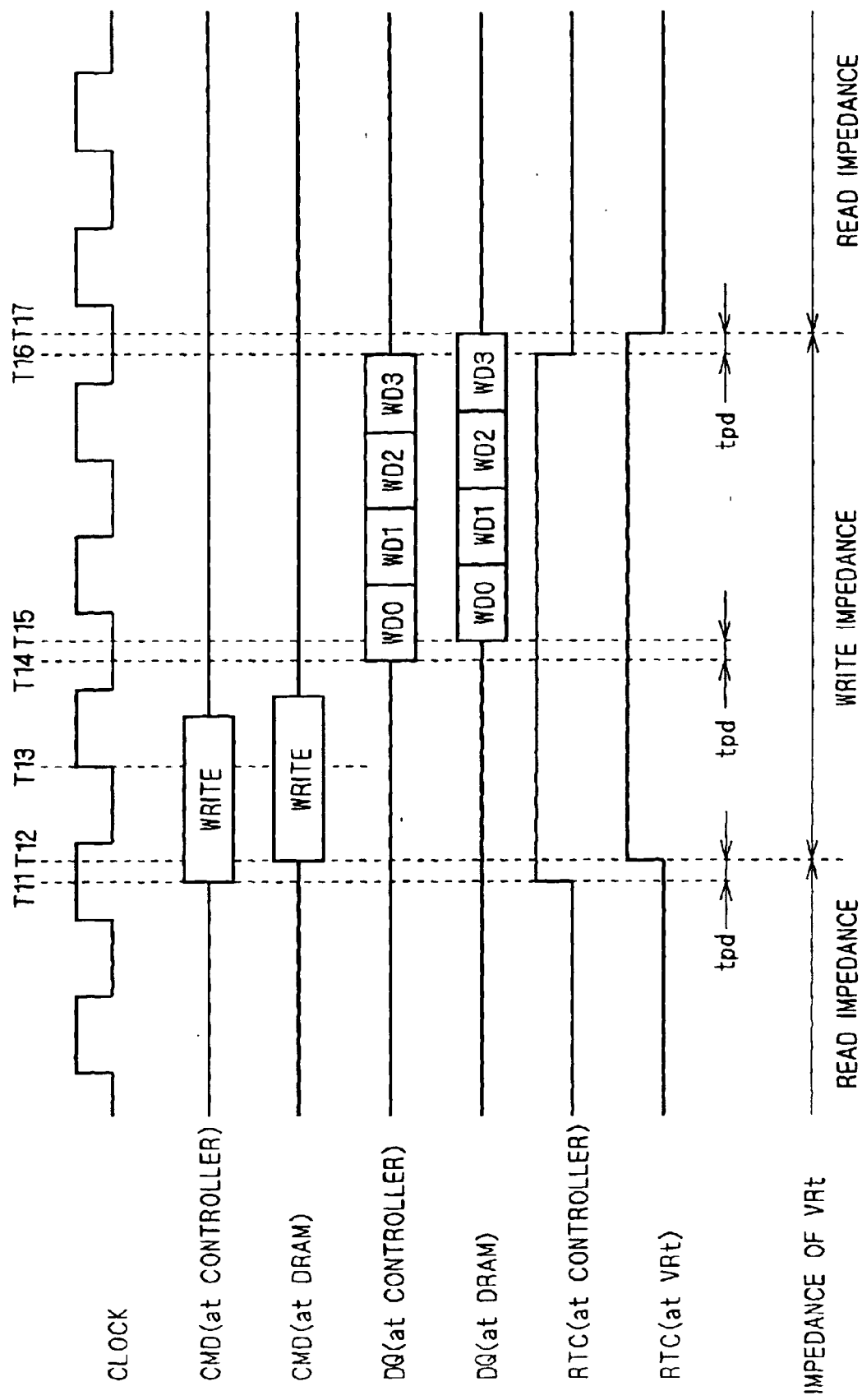
FIG. 6 is a timing chart showing operation of a memory system according to a third preferred embodiment.

FIG. 6 is a timing chart showing the operation of the memory system of this preferred embodiment. The operation of the memory system of this preferred embodiment is now described referring to FIG. 6. First, it is assumed that, in an initial state, the output of the RTC signal (RTC) from the memory controller 10 is set at "0" and the impedance of each terminating variable resistor VRt is set at the read impedance.

When the memory system enters the write mode where the memory controller 10 writes data to a DIMM, then, at time T11, the memory controller 10 outputs through the address/command bus 11 to the DRAM in the DIMM a command signal (CMD) "Write" indicative of writing, and also outputs an address signal (not shown) for specifying the address for writing. At the same time, the memory controller 10 also sets the RTC signal (RTC) at level "1" and outputs the RTC signal to the terminating variable resistors VRt through the RTC line 20.

The command signal "Write" outputted from the memory controller 10 at time T11 arrives at the DRAM at time T12 after the propagation delay tpd. The RTC signal "1" arrives at each terminating variable resistor VRt at the same time T12. Receiving the RTC signal "1," each terminating variable resistor VRt varies its impedance to the write impedance.

Then the command signal "Write" arriving at the DRAM from the memory controller 10 is recognized by the DRAM at time T13 at which the reference clock rises right after time T12. After outputting the command signal "Write," the memory controller 10 further outputs data to be written (DQ) onto the data bus 12 at given time T14. In the example of FIG. 6, 4-bit data WD0–WD3 is sequentially outputted from the memory controller 10.

The series of data WD0–WD3 outputted from the memory controller 10 starts arriving at the DRAM in DIMM at time T15 after the propagation delay tpd. The DIMM reads the series of data in timing synchronization with the reference clock signal (the timing of the DQS signal) and writes the data in the address specified by the address signal. In this process, the memory controller 10 keeps the RTC signal at "1" till time T16 at which it finishes the outputting of the last data WD3, and then it sets the RTC signal back to "0." Then the RTC signal "0" arrives at each terminating variable resistor VRt at time T17 after the propagation delay tpd. The terminating variable resistor VRt, receiving the RTC signal "0," varies its impedance to the read impedance.

As can be seen from FIG. 6, the terminating variable resistors VRt provide the write impedance between time T12 and time T17. That is to say, the impedance of each terminating variable resistor VRt is kept at the write impedance during the write operation by the DRAM.

Though not shown, when the memory system is in periods other than the write mode (during the read mode, standby state, etc.), the memory controller 10 keeps the RTC signal at "0" and each terminating variable resistor VRt maintains the read impedance. Therefore, when the memory system enters the read mode and the memory controller 10 reads data from the DIMM, the impedance of each terminating variable resistor VRt is the read impedance.

As shown above, according to the data bus of this preferred embodiment, the impedance of each terminating variable resistor VRt exhibits the write impedance in the write mode and exhibits the read impedance in other operations. That is, the terminating variable resistors VRt provide the read impedance during the read mode and the write impedance during the write mode. Thus, whether the operation mode is the read mode or write mode, i.e. whichever direction data is transferred, the data bus 12 can provide highly reliable data transfer.

<Fourth Preferred Embodiment>

This preferred embodiment shows a more specific example of the structure of the terminating variable resistors VRt shown in the third preferred embodiment. The structure of the memory system of this preferred embodiment is generally the same as that shown in FIG. 1 and its operation is the same as that shown in FIG. 6, so that they are not described again here.

Now, as in the second preferred embodiment, it is assumed that the main object in the read mode is to enlarge the signal waveform amplitude to ensure a larger operation margin and the main object in the write mode is to suppress signal distortion due to reflections. In this case, each terminating variable resistor VRt may be constructed as shown in FIG. 7, for example.

Figure 7:
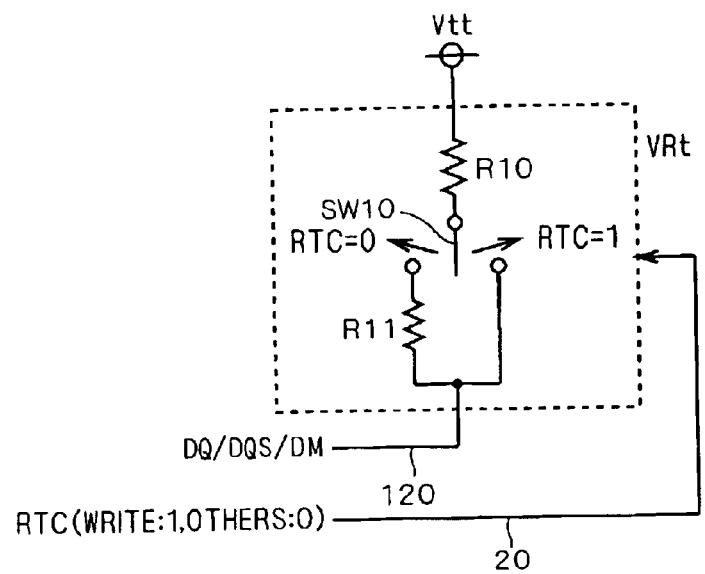
FIG. 7 is a diagram showing an example of the structure of terminating variable resistors in a memory system according to a fourth preferred embodiment.

Also in FIG. 7, the resistor R10 has a write impedance (here, a resistance value that can achieve impedance matching during write operations) and the resistor R11 has a given impedance, and the relay SW 10 is switched by the RTC signal sent from the memory controller 10. As can be seen from this diagram, the terminating variable resistor VRt of this preferred embodiment is constructed in almost the same way as that shown in FIG. 5.

However, in the third preferred embodiment, the relay SW10 operates in a reverse manner to that shown in the second preferred embodiment because the memory controller 10 outputs the RTC signal "1" during write operations. That is to say, it connects the resistor R10 directly to the signal line 120 of the data bus 12 when the RTC signal is "1" (i.e. during write operations), and it connects the resistor R10 to the resistor R11 when the RTC signal is 0 (i.e. during operations other than write operations).

When each terminating variable resistor VRt is constructed as shown in FIG. 7, the impedance of the terminating variable resistors VRt in write operation exhibits a value that can achieve impedance matching, and in read operation, it takes a value larger than the write impedance. Thus it is possible to certainly and easily obtain a sufficient operation margin in the read mode and suppress signal distortion in the write mode.

In the memory system of the present invention, as is clear also from this example, the terminating resistors can provide different effects in the read and write modes.

<Fifth Preferred Embodiment>

Figure 8:
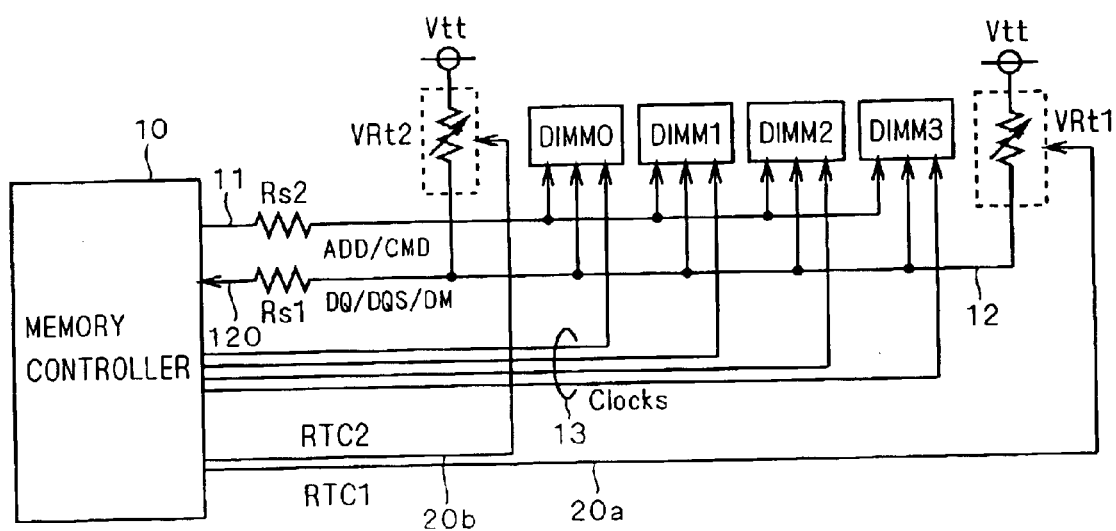
FIG. 8 is a diagram showing the structure of a memory system according to a fifth preferred embodiment.

FIG. 8 is a diagram showing the structure of a memory system according to a fifth preferred embodiment. As shown in this diagram, at the first end of the data bus 12, terminating variable resistors VRt2 for terminating the signal lines 120 are further provided along with the series resistors Rs1. In other words, the terminating elements of this preferred embodiment include the terminating variable resistors VRt1 connected to the second ends of the signal lines 120 and the terminating variable resistors VRt2 connected to the first ends of the signal lines 120.

In this preferred embodiment, a first RTC signal RTC1 for controlling the impedance (resistance value) of each terminating variable resistor VRt1 and a second RTC signal RTC2 for controlling the impedance (resistance value) of each terminating variable resistor VRt2 are separately provided. That is to say, the terminating variable resistors VRt1 and the terminating variable resistors VRt2 are controlled separately and independently. For example, as shown in FIG. 8, the memory controller 10 outputs the first and second RTC signals RTC1 and RTC2, with a first RTC line 20a transferring the first RTC signal between the memory controller 10 and the terminating variable resistors VRt1 and with a second RTC line 20b transferring the second RTC signal between the memory controller 10 and the terminating variable resistors VRt2. In other respects the memory system is constructed in the same way as that shown in FIG. 1.

Operation of this memory system may be the same as that shown in FIG. 3 or 6. In these cases, the first RTC signal and the second RTC signal always provide the same values, where the memory system is constructed and operated in substantially the same way as the memory system shown in FIG. 4 in the first preferred embodiment. However, since the memory controller 10 independently controls the terminating variable resistors VRt1 and VRt2, the operation shown below is also possible.

Figure 9:
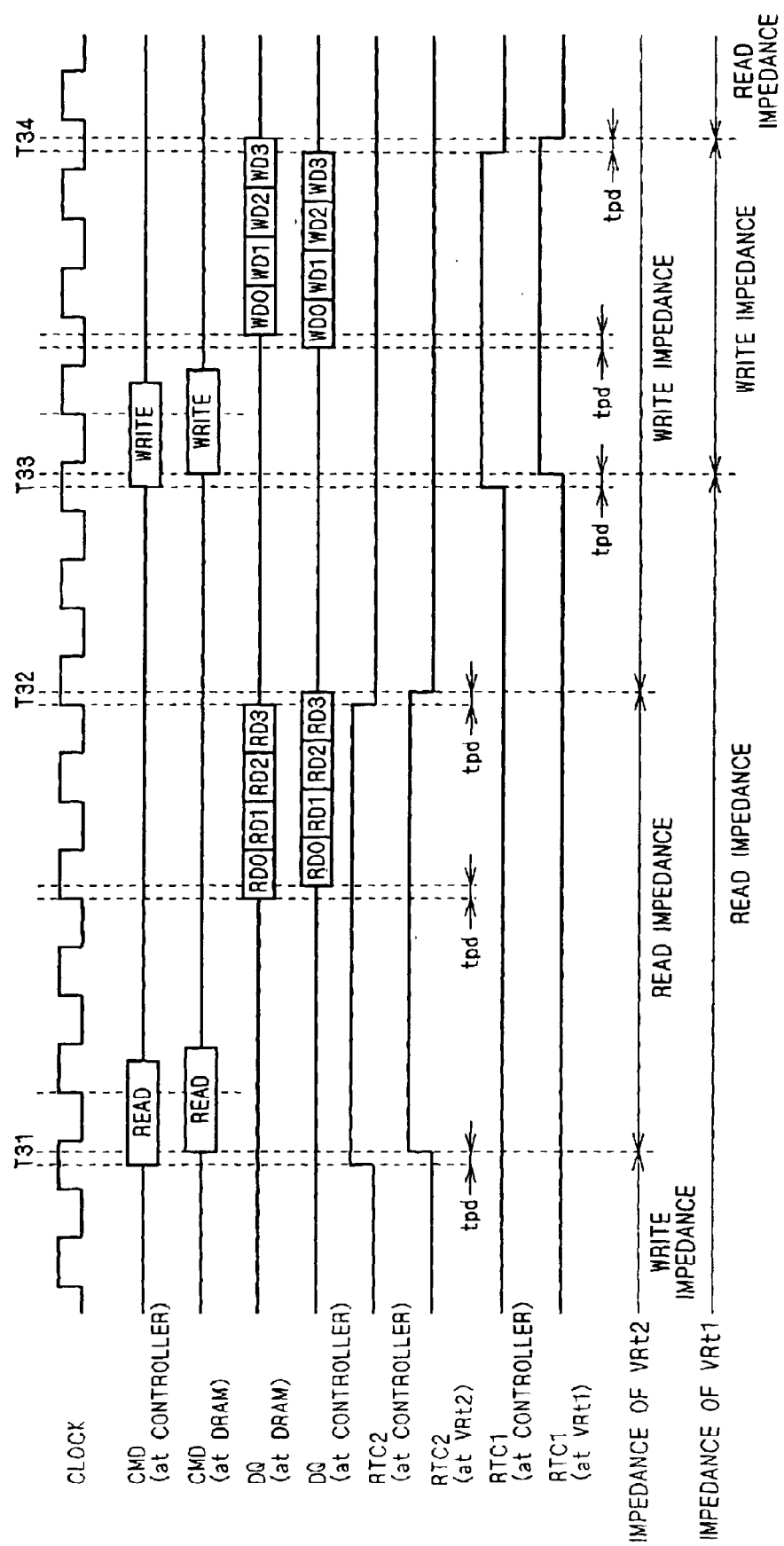
FIG. 9 is a timing chart showing an example of operation of the memory system of the fifth preferred embodiment.

FIG. 9 is a timing chart showing an example of operation of the memory system of the fifth preferred embodiment. As can be seen from FIG. 9, the memory system operates as shown in FIG. 3 in regard to the output of the second RTC signal RTC2, and operates as shown in FIG. 6 in regard to the output of the first RTC signal RTC1. That is, the impedance of each terminating variable resistor VRt2 exhibits the read impedance during the data read operation from the DIMM (between time T31 and time T32) and exhibits the write impedance during other operations. On the other hand, the impedance of each terminating variable resistor VRt1 exhibits the write impedance during the data write operation to the DIMM (between time T33 and time T34) and exhibits the read impedance during other operations.

Thus, as a result, the terminating variable resistors VRt1 and VRt2 both exhibit read impedance during read operations and both exhibit write impedance during write operations. This enables the data bus 12 to offer highly reliable data transfer in both read and write modes.

As shown above, in this preferred embodiment, the impedance values of the terminating variable resistors VRt1 and VRt2 are controlled separately and independently, which increases the degree of freedom of control. It is possible to provide various impedance values with combinations of impedance values of the terminating variable resistors VRt1 and VRt2. This will be effective when the memory system is provided with multiple functions and the data bus 12 transfers signals of various frequencies.

<Sixth Preferred Embodiment>

This preferred embodiment shows a more specific example of the structure of the terminating variable resistors VRt1 and VRt2 of the fifth preferred embodiment. In this preferred embodiment, it is assumed that the memory system is generally constructed as shown in FIG. 8 and operates as shown in FIG. 9, which are not described again here because they were already described in the fifth preferred embodiment.

Figure 10:
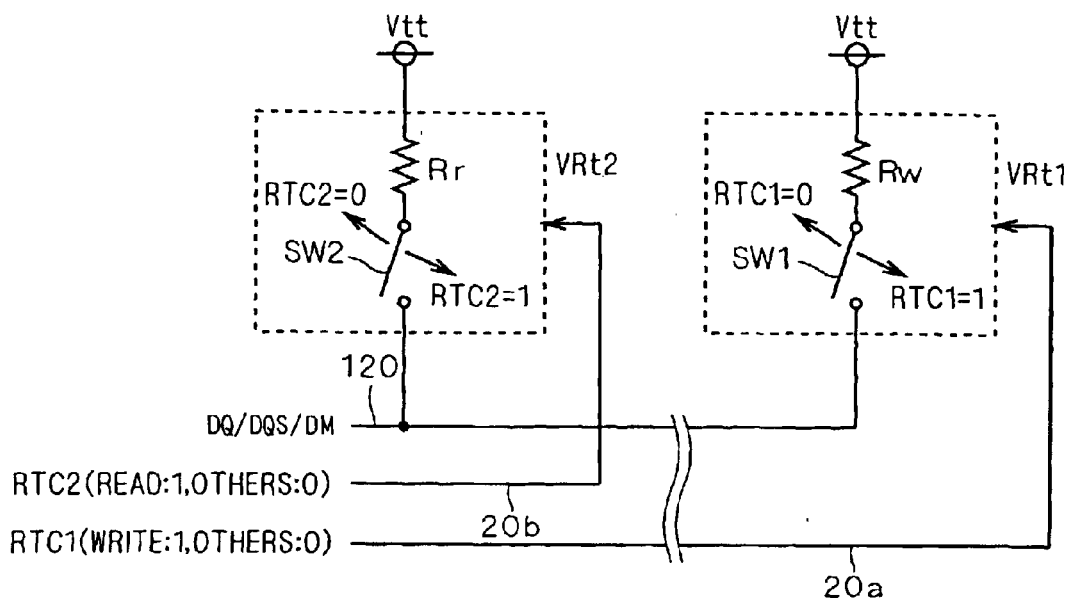
FIG. 10 is a diagram showing an example of the structure of the terminating variable resistors in a memory system according to a sixth preferred embodiment.

FIG. 10 is a diagram used to describe the structure and operation of the terminating variable resistors VRt1 and VRt2 in the memory system of this preferred embodiment. As shown in FIG. 10, the terminating variable resistor VRt1 includes a resistor Rw having the write impedance and a relay SW1, and the terminating variable resistor VRt2 includes a resistor Rr having the read impedance and a relay SW2. The relay SW1 is controlled by the first RTC signal (RTC1) and turns ON when the first RTC signal is "1" (during write operations) and turns OFF when it is "0" (operations other than write operations). On the other hand, the relay SW2 is controlled by the second RTC signal (RTC2) and turns ON when the second RTC signal is "1" (during read operations) and turns OFF when it is "0" (during operations other than read operations).

Thus, during write operations to the DIMMs, the impedance of the terminating variable resistor VRt1 exhibits the write impedance and the impedance of the terminating variable resistor VRt2 exhibits infinity. On the other hand, during read operations, the impedance of the terminating variable resistor VRt1 exhibits infinity and the impedance of the terminating variable resistor VRt2 exhibits the read impedance. In other words, only the impedance of the resistor Rw functions during write operations and only the resistor Rr functions during read operations.

The terminating variable resistors VRt1 are connected to the signal lines of the data bus 12 in a position closer to the DIMMs, than the position where the terminating variable resistors VRt2 are connected, and the terminating variable resistors VRt2 are connected in a position closer to the memory controller 10, than the position where the terminating variable resistors VRt1 are connected.

As mentioned earlier, the signal distortion at the signal receiving end can be more effectively suppressed as the terminating resistor is connected to the signal line in a position closer to the receiving end. Therefore, in the write mode, this preferred embodiment effectively suppresses the distortion of signal inputs to the DIMMs, and in the read mode, it effectively suppresses the distortion of signal inputs to the memory controller 10. Thus, as compared with the fifth preferred embodiment, this preferred embodiment can still more effectively suppress signal distortions in the read and write modes.

<Seventh Preferred Embodiment>

Figure 11:
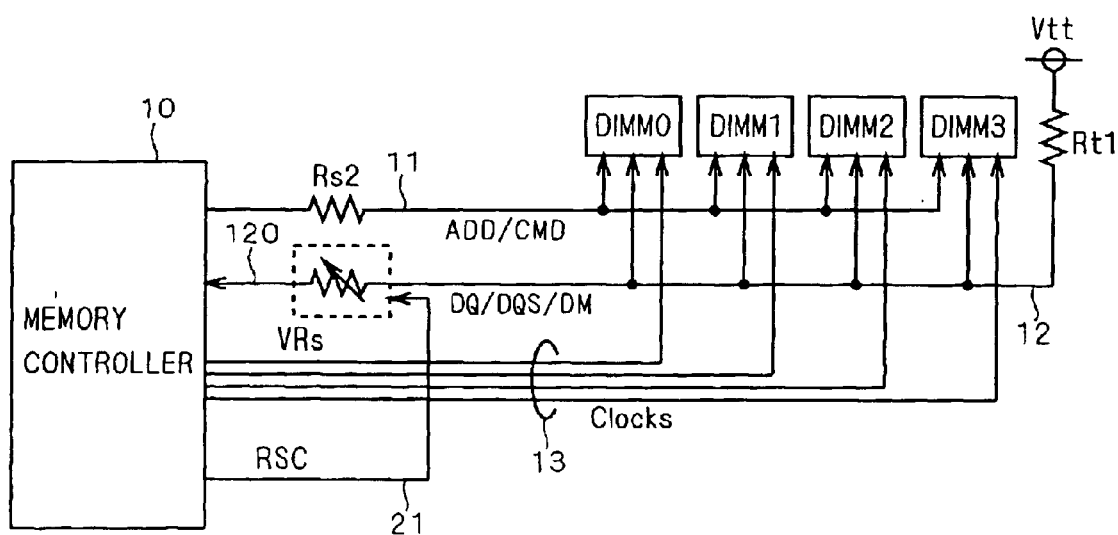
FIGS. 11 and 12 are diagrams showing the structure of a memory system according to a seventh preferred embodiment.

FIG. 11 is a diagram showing the structure of a memory system according to a seventh preferred embodiment. As shown in FIG. 11, this preferred embodiment describes a memory system in which the series resistors Rs1 in the conventional memory system shown in FIG. 15 are replaced by variable resistors VRs (hereinafter referred to as "series variable resistors"). That is to say, the signal lines 120 of the data bus 12 are provided with the series variable resistors VRs and the terminating resistors Rt. The impedance of each series variable resistor VRs can be controlled with an externally applied control signal (hereinafter referred to as an "RSC signal").

The memory controller 10 may control the impedance of each series variable resistor VRs by outputting the RSC signal, while controlling read and write operations to and from the DIMMs. When the memory controller 10 thus has a function as an impedance controlling portion for controlling the impedance of the series variable resistors VRs, in other words, when the impedance controlling portion is contained in the memory controller 10, the memory system can be made smaller in size. The RSC signal is given to the series variable resistors VRs through an RSC line 21 for transferring the RSC signal.

Figure 12:
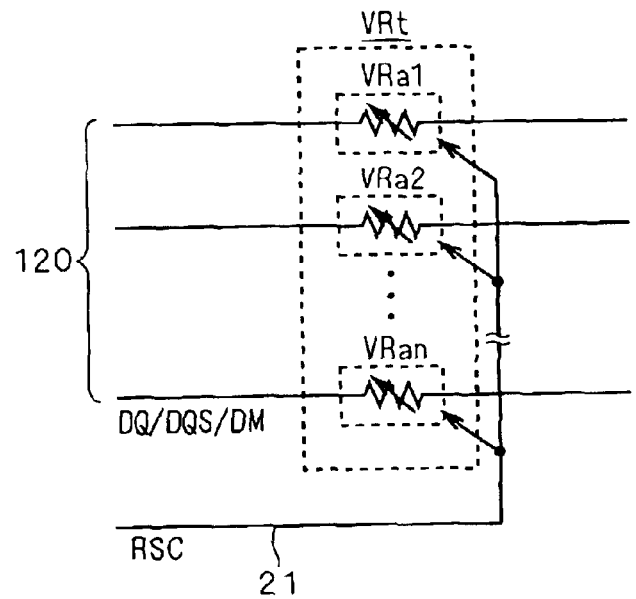

Though not shown in FIG. 11 for the sake of simplicity of the description, series variable resistors VRa1 to VRan (n is 108, for example), as shown in FIG. 12, are connected to the respective signal lines of the data bus 12. The drawings shown hereinafter also depict a plurality of series variable resistors VRs as one resistor as in FIG. 11.

The memory controller 10 in this preferred embodiment may control the impedance of the series variable resistors VRs with the RSC signal just as it controls the terminating variable resistors VRs with the RTC signal as described in the first or third preferred embodiment. That is to say, the series variable resistors VRs exhibit a read impedance during read operations and a write impedance during write operations. This enables highly reliable data transfer through the data bus 12 whether the mode is the read mode or the write mode.

<Eighth Preferred Embodiment>

Figure 13:
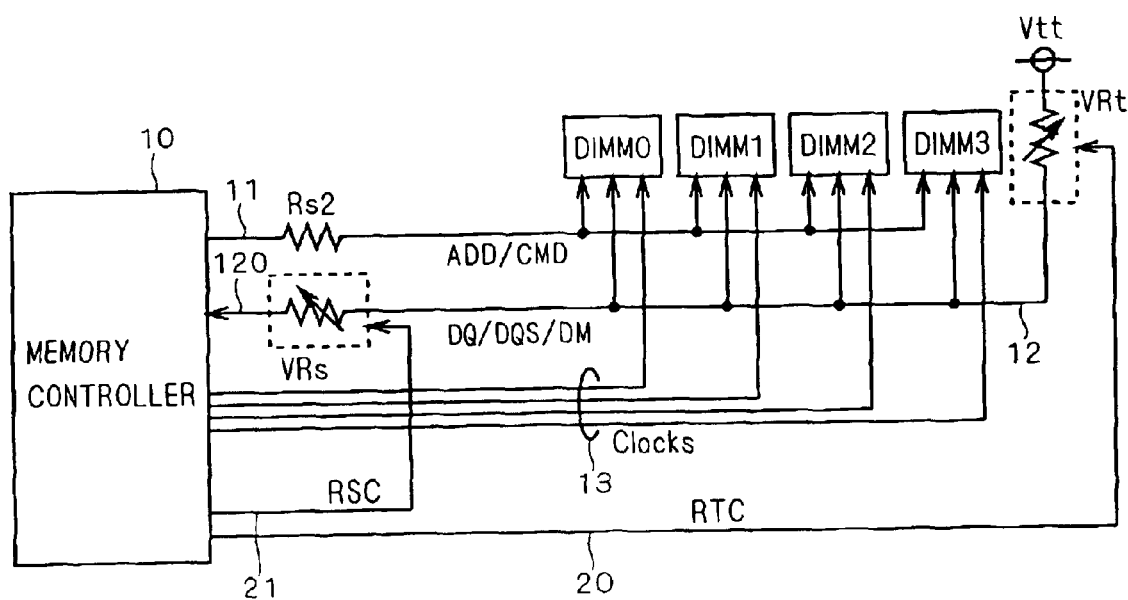
FIGS. 13 and 14 are diagrams each showing the structure of a memory system according to an eighth preferred embodiment.

While in the seventh preferred embodiment the terminating resistors connected to the signal lines 120 of the data bus 12 have a fixed impedance value, the series variable resistors VRs may be used in combination with the terminating variable resistors shown in the first to sixth preferred embodiments. For example, FIG. 13 shows a structure in which they are used in combination with the terminating variable resistors VRt of the first preferred embodiment, and FIG. 14 shows a structure in which they are used in combination with the terminating variable resistors VRt1 and VRt2 of the fifth preferred embodiment.

With such combinations, the impedances of the terminating variable resistors and series variable resistors of the signal lines 120 of the data bus 12 can be set at a read impedance in read operation and at a write impedance in write operation. Thus the data bus 12 offers highly reliable data transfer whether the mode is the read mode or the write mode.

Figure 14:
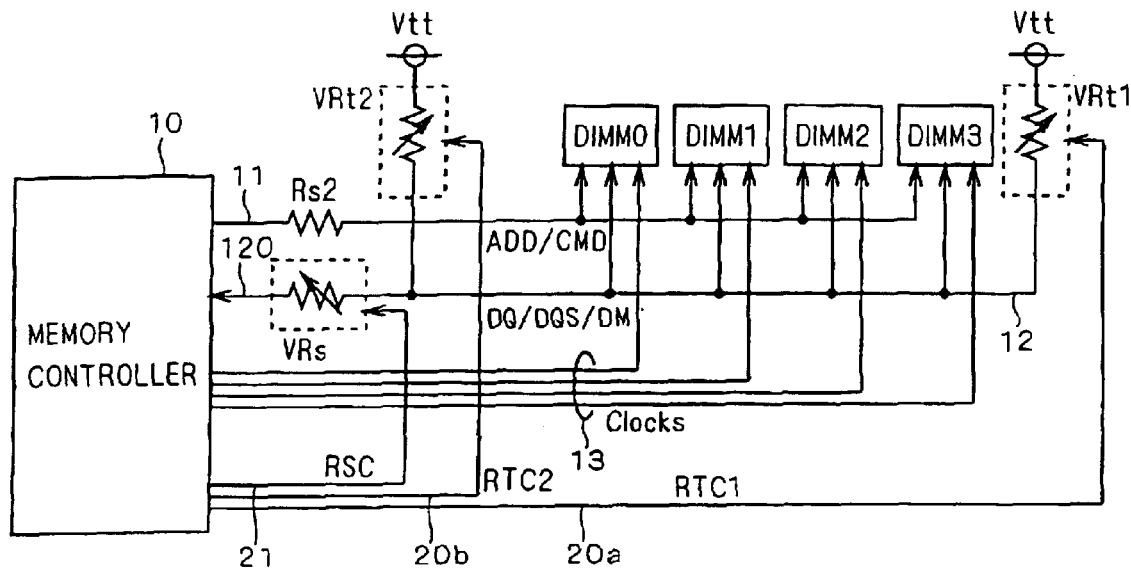

For example, FIG. 14 shows an example in which the series variable resistors VRs and the terminating variable resistors VRt1 and VRt2 are independently controlled with the RSC signal and the first and second RTC signals; however, they all may be controlled with a single control signal. This simplifies the structure of the memory controller 10 having the function as the impedance control portion, which contributes to size reduction and cost reduction of the memory system.

On the other hand, a system in which the memory controller 10 independently controls the series variable resistors VRs and the terminating variable resistors VRt1 and VRt2 provides increased freedom of control and offers various impedance values by variously combining the impedance values of the series variable resistors VRs and the terminating variable resistors VRt1 and VRt2.

While the invention has been described in detail, the foregoing description is in all aspects illustrative and not restrictive. It is understood that numerous other modifications and variations can be devised without departing from the scope of the invention.

What is claimed is:

1. A data bus comprising:
   a signal line capable of bidirectionally transferring data, said signal line including a first end and a second end; and
   at least one terminating element connected between at least one of said first end and said second end and a voltage supply line,
   said at least one terminating element having impedance that can be varied in accordance with the direction in which said data is transferred.

2. The data bus according to claim 1, further comprising a variable impedance element connected in series to said signal line separated from said at least one terminating element,
   wherein said variable impedance element is configured to provide a second variable impedance in accordance with the direction in which said data is transferred.

3. A data bus comprising:
   a signal line including a first end, a second end, and at least one third end branching off between said first end and said second end and capable of bidirectionally transferring data;
   a memory capable of performing read and write operations of said data being connected to each of said at least one third end; and
   a variable impedance element connected in series to said signal line,
   said variable impedance element having impedance that can be varied in accordance with said read and write operations.

4. A data bus comprising:
   a signal line capable of bidirectionally transferring data; and
   at least one terminating element for terminating said signal line, wherein said at least one terminating element having impedance that can be varied in accordance with the direction in which said data is transferred;
   said signal line comprises a first end, a second end, and at least one third end branching off between said first end and said second end,
   a memory capable of performing read and write operations of said data is connected to each said at least one third end, and
   said at least one terminating element further comprises a first terminating variable resistor connected to said second end and being configured to provide different resistance values in said read and write operations.

5. The data bus according to claim 4, further comprising:
   a memory controller configured to send write data to said memory and configured to receive read data from said memory is connected to said first end, and
   the resistance value of said first terminating variable resistor is smaller in said write operation than in said read operation.

6. The data bus according to claim 4, wherein a second terminating variable resistor is connected to said first end and configured to provide different resistance values in said read and write operations.

7. The data bus according to claim 6, further comprising:

a memory controller configured to send write data to said memory and configured to receive read data from said memory, and the resistance value of said second terminating variable resistor is infinity in said write operation and the resistance value of said first terminating variable resistor is infinity in said read operation.

* * * * *